Dec. 19, 1967 W. HEYWANG ET AL 3,359,143

METHOD OF PRODUCING MONOCRYSTALLINE SEMICONDUCTOR MEMBERS WITH LAYERS OF RESPECTIVELY DIFFERENT CONDUCTANCE

Filed Jan. 7, 1965

3,359,143
Patented Dec. 19, 1967

3,359,143

METHOD OF PRODUCING MONOCRYSTALLINE SEMICONDUCTOR MEMBERS WITH LAYERS OF RESPECTIVELY DIFFERENT CONDUCTANCE

Walter Heywang and Erhard Sirtl, Munich, Germany, assignors to Siemens Aktiengesellschaft, a corporation of Germany Filed Jan. 7, 1965, Ser. No. 424,149
Claims priority, application Germany, Jan. 10, 1964, S 89,017
20 Claims. (Cl. 148—174)

ABSTRACT OF THE DISCLOSURE

Described is the method of producing monocrystalline semiconductor members with layers of respectively different conductance, which comprises placing a substrate of monocrystalline semiconductor material in face-to-face relation to a source body of semiconductor material, said source body having at least two layers of respectively different conductance forming with each other a junction parallel to the source side facing the substrate, the source layer at said side having the same type of conductance as said substrate; heating the source body and simultaneously subjecting it on said side to a gaseous atmosphere chemically combinable with the source material to deposit semiconductor material by transport reaction via the evolving gaseous compound from the source body onto the substrate, until at least two layers of respectively different conductance are transferred from the source body to the substrate.

Figure 1:
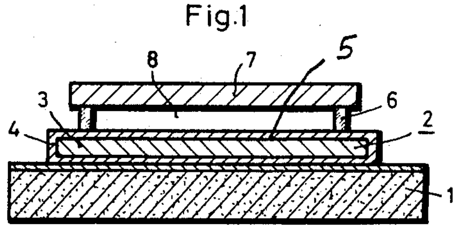

Our invention relates to a method of producing monocrystalline semiconductor members with layers of respectively different conductivities, namely different specific resistance and/or different type of conductance, by a chemical transport reaction on the so-called sandwich principle. With this method, semiconductance material is removed from a heated source body, such as a pellet, tablet or other amount of crystalline material, by converting it to a gaseous compound from which the semiconductor material is epitaxially precipitated upon a monocrystalline substrate of semiconductor material on the side facing the source body.

It has been found difficult to epitaxially grow monocrystalline layers of semiconductor material, particularly when precipitating silicon upon monocrystalline silicon of the opposed conductance type, in such a manner as to obtain an abrupt, sharp junction of these layers. This applies particularly when attempting to precipitate high-ohmic semiconductor material upon a more strongly doped and consequently less resistive semiconductor substrate.

It is an object of our invention to minimize the above-mentioned difficulties and to provide a method which affords the epitaxial production of sharply defined junctions between the resulting layers of different specific resistance and/or type of conductance.

Another object of the invention is to afford epitaxially precipitating semiconductor material upon a monocrystalline substrate in such a manner as to produce single or multiple p–n junction in a single, continuous transport-reaction process.

According to our invention, we place a substrate of monocrystalline semiconductor material in face-to-face or sandwich relation to a source body of semiconductor material having at least two layers of respectively different conductivities, that is different conductance values and/or different types of conductance, these layers forming with each other a junction parallel to the source side facing the substrate, the source layer on this side having the same type of conductance as the substrate. We then subject the source body at the just-mentioned side to a gaseous atmosphere capable of forming a gaseous chemical compound with the source material, and we heat the source body to thereby produce the compound and effect a chemical transport reaction which causes a deposition of material via the evolving gaseous compound from the source body onto the substrate, this transport reaction being carried out until at least two layers of respectively different conductivities are transferred from the source body to the substrate.

According to another feature of our invention, it is preferable to provide a source body in which the junction between the layers of respectively different conductivities is produced by diffusion, since such junctions are particularly sharp and planar. That is, the source body and the substrate preferably consist of plates, discs or wafers having a planar surface facing the transport-reaction interspace. The source body may consist of high-ohmic material, for example of n-type conductance, into which a doping substance is diffused in order to produce a p–n junction between the high-ohmic layer and a more highly doped surface layer of the opposed conductance type. With the aid of such a source body, the substrate, which may likewise be highly doped, may be provided with a sharp junction between a highly doped base layer and a high-ohmic, epitaxially grown film of semiconductor material having the opposed conductance type. This is done by depositing upon the highly doped semiconductor substrate first a highly doped layer of the same conductance type and precipitating upon this base layer the thin surface layer or film of the opposed conductance type. The impurity-atom content of the layers thus epitaxially precipitated by the transport reaction upon the substrate is essentially determined only by the impurity-atom content of the layers removed from the source body and therefore can be given a predetermined, definite dopant concentration. The junction contained in the source body between layers of respectively different conductivities, therefore, is directly transferred to the substrate without substantially modifying the properties of the junction.

It is known to epitaxially precipitate semiconductor layers of respectively different conductance properties upon monocrystalline discs or other substrates of semiconductor material in a reaction chamber, by supplying the chamber with a gaseous compound of the semiconductor material to be precipitated, usually in mixture with a carrier gas, and thermally dissociating the gaseous compound so that the evolving semiconductor material precipitates upon the substrate. In this method, the adjustment of a desired degree of conductivity in the precipitated layers, as a rule, is effected by adding to the gaseous atmosphere a given quantity of a gaseous doping substance or a gaseous compound of doping substance in mixture with a carrier gas, for example hydrogen. For producing junctions between layers of respectively different conductivities, the ratio of gaseous semiconductor compound to doping substance is varied or a different doping substance for imparting a different conductance type to the precipitating material, is supplied into the reaction vessel. However, it has been found that abrupt, sharp junctions between the layers cannot be readily obtained in this manner because residues of doping substance employed during a preceding precipitation of a layer will always remain in the reaction space, either within the gas volume or condensed on the colder vessel walls, and these residues interfere with the formation of an abrupt junction. Above all, the known method does not afford growing thin high-ohmic layers or films upon an already precipitated, doped layer, as can be readily done with the method according to present invention.

A variety of gaseous substances are suitable as transporting agents for the method according to the invention.

Particularly well applicable are halogens or hydrogen halides. Likewise applicable are water vapor (steam) and hydrogen sulphide mixed with hydrogen or argon. Investigation upon which the invention is predicated, has shown that generally all substances are suitable for the transport reaction that are capable of entering into a reversible reaction under formation of exclusively gaseous compounds, with the semiconductor source material, such as silicon or germanium. The reaction is initiated and maintained by providing for a temperature gradient between the source body and the side of the substrate facing the source body. Such a temperature gradient, amounting for example to but 2 to 5° C., may be effected by providing for an impeded heat transfer from the heated source body to the slightly cooler substrate body, the latter being in contact with the source body, for example by being simply placed upon the source body.

The gas mixture penetrates into the narrow space between the source body and the monocrystalline substrate. This applies, for example, when using gaseous hydrogen chloride as transporting agent in mixture with a carrier gas, such as hydrogen, for precipitating silicon upon a substrate of silicon. The surface of the source body, such as a planar plate of silicon, and also the surface of the monocrystalline substrate, even if these surfaces are polished, possess slight irregularities on account of which slight but sufficient interspaces in the order of a few microns will remain between source body and substrate. It is preferable to grind or lap the surface of the source body to planar shape.

The following example will explain the occurring transport reaction with respect to the precipitation of silicon just mentioned.

Hydrogen chloride reacts with the heated silicon of a source body in accordance with the equation $$2HCl+Si \rightarrow SiCl_2+H_2 \quad (1)$$

At temperatures of about 1100° C. considerable quantities of silicon subchloride $SiCl_2$ are formed in the interspace between source and substrate. The temperature gradient then results in a silicon transport reaction via the gaseous phase in accordance with the equation $$Si + 2HCl \underset{\text{lower temperature}}{\overset{\text{higher temperature}}{\rightleftharpoons}} SiCl_2 + H_2 \quad (2)$$

and partly also in accordance with the equation $$2SiCl_2 \rightleftharpoons Si+SiCl_4 \quad (3)$$

As a result, elemental silicon is precipitated at the locality of the lower temperature. Consequently the transport reaction causes silicon to be removed from the source body and to be transferred to the less heated side of the silicon substrate. The $SiCl_2$ partial pressure increases with a higher temperature of the source body.

When the method according to the invention is performed with a flowing reaction gas, some amount of material is also eliminated from the free surface portion or backside of the substrate. In order to keep this undesired effect as slight as feasible, the hydrogen halide being used must be greatly diluted with carrier gas such as hydrogen or argon. However, the undesired elimination of material can be largely prevented by operating in a sealed reaction vessel which contains the hydrogen halide and the hydrogen or other carrier gas in such a composition that a precipitation takes place essentially only on the proper side of the substrates by the effect of the transport reaction.

The source body need not necessarily consist of the same semiconductor material as the substrate but may also be formed of a different semiconductor material, provided its crystalline lattice structure and lattice constant coincide with that of the substrate semiconductor material at least in approximation. Thus, for example, a substrate or silicon may be used together with a source body of germanium, in which case monocrystalline germanium is transferred onto the silicon substrate. Similarly, gallium arsenide may be precipitated from a corresponding source body upon the facing side of a substrate consisting of germanium.

The epitaxial growth resulting from the transport reaction takes place with great uniformity and is readily controllable since the dependency of this growth upon the molar ratio of the gas mixture and upon the flow conditions in the reaction chamber is very slight. Since the doping concentration of the grown layer is dependent only upon the impurity-atom content of the source body, the dopant concentration in the grown epitaxial layers can be adjusted very accurately in a well defined manner.

One way of heating the source body of semiconductor material and the substrate is to employ a directly heated heater structure upon which the source body is placed. This heater structure may consist of graphite. The heating of the substrate then takes place by impeded heat transfer from the source body or the heater. To prevent contamination of the precipitated layers it is preferable to provide the graphite heater with a coating of semiconductor material at least at the heater side facing the source body. The coating on the heater may also be produced by thermal dissociation of a gaseous compound of the semiconductor material.

Another way of providing heat for the method according to the invention is to directly heat the substrate. In this case the heating of the source body is due to impeded heat transfer from the substrate. The source body in this case must be additionally heated in order to maintain a slightly higher temperature than obtaining at the substrate side facing the source body.

As a rule, and relating to the transfer of silicon from a silicon source to a silicon substrate, the substrate is kept at a temperature between about 1100 and about 1200° C., preferably at 1150° C.±10° C. The source body at the side facing the substrate must have a temperature which is about 2 to 5° C., preferably approximately 3° C. higher than that of the substrate side facing the source body. This applies regardless of whether the source body or the substrate is primarily heated.

The speed of transportation depends upon the composition of the reaction gas mixture and, aside from the temperature conditions, also upon the length of the diffusion path between source body and substrate. That is, the spacing between the source body and the substrate should be small relative to the free mean path of the molecules transporting the semiconductor material, for example the subchloride molecules. This condition is always reliably satisfied if the substrate plate, disc or wafer is directly placed flat upon the planar top of a source plate or body, or vice versa, in which case the remaining distance is in the molecular range and not more than in the order of 1$\mu$, assuming that the mutually facing surfaces are lapped or polished. This applies to operation at normal atmospheric pressure. However, an increased transport reaction is obtained when operating at negative pressure which also permits increasing the distance between the source body and the substrate, for example by inserting a spacer of inert material between the source body and substrate. The use of such a spacer is particularly advantageous when the respective surfaces of source body and substrate are polished; and the negative pressure can be readily adjusted to a value at which the transporting effect is prevented from declining below a desired minimum. The height of the spacer may be 100 to 500$\mu$, for example. The spacer may consist of small cubic bodies or discs or it may have the shape of a ring which surrounds the source body or substrate in substantially coaxial relation. The spacer preferably also serves as a support for the substrate or source body.

When performed in the above-described manner, the method of the invention results in the transfer of layers having respectively different specific resistances and/or types of conductance from the semiconductor source, such as tablets or other crystalline bodies, onto the side of the substrate facing the source. However, the method may also be performed in a modified mode in order to precipitate semiconductor material also upon the backside of the substrate. One way of doing this is as follows: The reaction vessel containing the source body in contact with the substrate, is supplied with a gaseous compound of the semiconductor material to be epitaxially precipitated upon the backside of the substrate, this compound being for example a halogen compound or a halogen-hydrogen compound of the semiconductor material. The halogen compound, preferably mixed with hydrogen, is thermally dissociated essentially at the hot side of the substrate facing away from the above-mentioned source body and is thus expitaxially precipitated upon the latter side of the substrate. This reaction takes place, for example, in accordance with the equation $$(4) \qquad SiHCl_3+H_2 \rightarrow Si+3HCl$$

A slight quantity of the gaseous compound of semiconductor material, consisting in the present example of silicochloroform, also penetrates into the narrow interspace between the source body and the substrate where it is likewise dissociated so that semiconductor material, in this case silicon, is precipitated. However, before further reaction gas can additionally diffuse into the narrow interspace, the hydrogen chloride evolving in accordance with Equation 4, due to the concentration of the silicochloroform and the hydrogen in the penetration gaseous mixture, causes the formation of the subchloride of the semiconductor material of the source body in accordance with the Equation 1. Consequently, the above-described transport reaction will now take place in the interspace, and this results in precipitation of semiconductor material from the source upon the facing side of the substrate.

The concentration of the gaseous halogen compound of the semiconductor material and of the hydrogen in the gas mixture introduced into the reaction chamber, may be so chosen relative to the operating temperature that the growth of semiconductor material upon the backside of the substrate is in the same order of magnitude as the transportation of source material onto the facing side of the substrate. For example, we have ascertained that at a $SiCl_2$ partial pressure of at least $10^{-6}$ atmospheres the two precipitation effects (front and backside) are in equilibrium with each other.

If desired, a gaseous halogen hydrogen compound, for example hydrogen chloride, may be admixed from the outset to the gaseous halogen compound introduced into the reaction chamber for precipitation of semiconductor material onto the backside of the substrate.

However, when introducing a gaseous semiconductor compound into the reaction chamber, the production of an epitaxial coating limited to the substrate side facing the source body of semiconductor material may also be secured by either operating with a non-flowing gas, that is in a sealed system, or by covering the substrate with a cover plate of inert material on the side facing away from the source body.

The cover plate may consist of quartz, corundum ($Al_2O_3$) or silicon carbide. It is preferable if the cover plate consists of silicon carbide at least on the side facing and contacting the substrate.

It will be understood from the foregoing that the method of the invention affords growing on a semiconductor substrate, in a single operation and sequentially, several layers having respectively different specific resistances and/or different types of conductance, by transferring material via transport reaction from a source body. Thus, for example, while a p-n junction is being grown on one side of the substrate, the other side of the substrate may be simultaneously coated with an epitaxially growing layer of the same or a different semiconductor material. If desired, the epitaxial coating on the backside may be given a dopant content different from that of the substrate as well as from that of one or more layers of the source body.

As mentioned, the resistivity and the type of conductance of the layers thus precipitated by transport reaction are determined only by the doping of the layers eliminated from the source body, whereas the specific resistance and type of conductance in the layers on the backside of the substrate are determined by the addition of doping substance to the gaseous mixture supplied into the reaction vessel.

Figure 2:
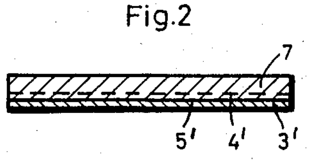

The invention will be further described with reference to the drawing and a preferred processing example. On the drawing:

FIG. 1 shows schematically and in section an assembly of a source body and a substrate on a heated carrier during performance of the process; and FIG. 2 shows schematically and in section the resulting epitaxially coated substrate.

The assembly shown in FIG. 1 comprises a heater structure 1 of graphite whose planar top surface is coated with silicon. Placed upon the heater is a source body 2 consisting of a circular disc 3 of silicon. The disc has a high-ohmic core region 3 of one conductance type and a diffusion doped surface region 4 of much higher conductance of the opposed type so as to form an abrupt p-n junction 5 with the core region 3. The flat surfaces of the disc-shaped silicon source body 5 are polished. Placed on top of the source disc 2 is a spacer ring 6 of quartz. The ring, however, may also be substituted by a number of individual spacer bodies or may otherwise correspond to the various spacers described in the copending application of Sirtl et al. for Method of Producing Semiconductor Devices, Ser. No. 323,307, filed Nov. 13, 1963. The spacer 6 supports a substrate 7 consisting of highly doped silicon and having likewise the shape of a circular disc. The substrate 7 has the same conductance type as the diffusion region 4 and approximately the same conductivity (specific resistance).

The above-described transport reaction takes place in the interspace denoted by 8. The reaction is effected by introducing hydrogen halide greatly diluted by hydrogen, the gaseous mixture being passed in flowing condition through a processing vessel in which the entire assembly is located. Another way of performing the transport reaction is to enclose the illustrated assembly in a sealed vessel filled with a silicon-halogen-hydrogen compound in mixture with hydrogen. The transport reaction in either case is initiated and maintained by heating the graphite heater 1 to the required temperature. This is done by passing electric current through the graphite heater, although a separate resistance or radiation heater may also be employed for this purpose. As a result of the transport reaction, silicon from the source body 2 is transferred onto the bottom side of the substrate 7. In this manner the p-n junction 5 is transferred from the source body 2 to the substrate 7 without appreciably blurring the junction fronts. By continuing the process, the high-ohmic semiconductor material of the core region 3 is transferred to the substrate 7 the extent required to form a coating or film of any desired thickness.

FIG. 2 shows the substrate 2 after completion of the process. The original substrate disc or wafer 7 is now coated with a layer 4' of highly doped silicon corresponding to the surface region 4 of the source body 2, and the layer 4' is covered by a surface layer 3' of high-ohmic silicon stemming from the core region 3 of the source body. Since the original regions 3 and 4 of the source body have mutually different types of conductance respectively, the epitaxial layers 3' and 4' preserve this difference and thus from a corresponding p-n junction 5'.

Described presently are details of a processing example performed in the manner explained with referenc to FIGS. 1 and 2.

The processing vessel employed was formed of a water-cooled base plate of copper and a quartz bell placed upon the base and thus enclosing the above-described heater 1 of graphite. With the bell removed and the heater 1 cold, the circular source body 2 was placed flat on top of the heater. The source disc consisted of monocrystalline p-type silicon of 200 to 300 ohm·cm. specific resistance having a diameter of about 20 mm. and a thickness of about 1 mm. The disc was lapped, polished and etched and then subjected on all sides to diffusion with donor dopant (arsenide), thus being coated with n-type surface region of a few micron thickness. Used as a spacer 6 was a ring cut from a quartz tube, having an outer diameter of about 16 mm., a height of about 400$\mu$ and a radial thickness of about 200$\mu$. It will be understood that the geometric dimensions of the spacer and other components are not critical. This applies also to the height of the spacer because the gas pressure in the vessel can be readily kept within a range in which the desired transport reaction will reliably occur, as explained in the foregoing. The planar sides of the spacer ring were lapped, and the top side was provided with four radial slots in crosswise arrangement to facilitate ingress of gas, although this was found not to be a necessary requirement for performing the process. The substrate 7 placed on top of the ring consisted of monocrystalline (111)-oriented p-type silicon of approximately 0.2 ohm·cm. specific resistance having a diameter of approximately 18 mm. and a thickness of about 300$\mu$. The disc side to be epitaxially coated was lapped and etched.

After assembling the components on the base and completing the vessel by placing the bell upon the base, the interior of the vessel was rinsed for 30 minutes with hydrogen at room temperature. Thereafter the heater 1 was heated to 1200° C., resulting in a substrate temperature of 1150±10° C. Under these conditions, the side of the source body 2 facing the substrate 7 has a temperature about 2 to 4° C. higher than the facing side of the substrate. With the components at the reaction temperature, the reaction gas was supplied to the vessel. The gas was composed of hydrogen and 1.5 mole percent silicon tetrachloride, passing through the vessel at flow speed of about 30 cm. per minute.

Under these operating conditions, an epitaxial silicon film was precipitated on the substrate at a rate of growth amounting to approximately 0.83 micron per minute. The process was performed a sufficient length of time to transfer the entire surface region 4 from the top side of the source body 2 to the substrate 7 and additionally a surface layer of high-ohmic p-type material from the core region 3 having the desired thickness. Consequently the entire duration of the process depends upon the thickness which the epitaxially grown layer of film is to reach on the substrate. As explained, the process, when performed in the manner just described, is preferably carried out at negative pressure. However, it may also be performed without the spacer ring at normal atmospheric pressure.

The process is analogously applicable to various other semiconductor materials and with other gas compositions, for example as described in the above-mentioned copending application Ser. No. 323,307 or in the copending application of E. Sirtl, Ser. No. 386,258, filed July 30, 1964, in U.S. Patent 3,140,966 or in the AIME publication Metallurgy of Semiconductor Materials, Interscience Publishers, volume 15, Aug. 30, to Sept. 1, 1961.

To those skilled in the art, it will be obvious, upon a study of this disclosure, that our invention permits of various modifications and may be given embodiments other than particularly illustrated and described herein, without departing from the essential features of the invention and within the scope of the claims annexed hereto.

We claim:

1. The method of producing monocrystalline semiconductor members with layers of respectively different conductance, which comprises placing a substance of monocrystalline semiconductor material in face-to-face relation to a source body of semiconductor material, said source body having at least two layers of respectively different conductance forming with each other a junction parallel to the source side facing the substrate, the source layer at said side having the same type of conductance as said substrate; heating the source body and simultaneously subjecting it on said side to a gaseous atmosphere chemically combinable with the source material to deposit semiconductor material by transport reaction via the evolving gaseous compound from the source body onto the substrate, until at least two layers of respectively different conductance are transferred from the source body to the substrate.

2. In the transport-reaction method of producing monocrystalline semiconductor members according to claim 1, the two layers of the source body having respectively different types of conductance and forming a p-n junction on the substrate, whereby the p-n junction is transferred from the source body to the substrate.

3. The transport-reaction process of producing monocrystalline semiconductor members according to claim 1, wherein the two layers of the source body have respectively different specific resistances.

4. The transport-reaction process of producing monocrystalline semiconductor members according to claim 1, wherein the surface layer of the source body is diffusion doped and differs in conductivity type and specific resistance from the adjacent layer of said body.

5. The method of producing monocrystalline semiconductor members with layers of respectively different conductance, which comprises placing a substrate of monocrystalline semiconductor material in face-to-face relation to a source body of semiconductor material, said source body having a high-ohmic core layer of a given conductance type and a diffusion-doped low-ohmic surface layer of the other conductance type forming with the core layer a p-n junction parallel to the source side facing the substrate, the substrate having approximately the same resistance and the same conductance type as said surface layer; subjecting said source body on said side to a gaseous atmosphere chemically combinable with the source material to deposit semiconductor material by transport reaction via the evolving gaseous compound from the source body onto the substrate, until two p-n junction forming layers are transferred from the source body to the substrate.

6. The transport-reaction process of producing monocrystalline semiconductor members according to claim 1, wherein the source body has a lapped surface on said side.

7. The transport-reaction method of producing monocrystalline semiconductor members according to claim 1, which comprises inserting spacer means of inert material between the source body and the substrate.

8. The transport-reaction method of producing monocrystalline semiconductor members according to claim 1, which comprises surrounding the source body by a spacer ring of inert material and supporting the substrate on top of the spacer ring.

9. The transport-reaction process of producing monocrystalline semiconductor members according to claim 1, wherein the source body and the substrate consist of the same semiconductor material.

10. The transport-reaction process of producing monocrystalline semiconductor members according to claim 1, wherein the source body and the substrate consist of respectively different semiconductor materials.

11. The method of producing monocrystalline semiconductor members with layers of respectively different conductance, which comprises placing a flat source body of semiconductor material on top of a heater, placing a substrate in face-to-face relation above the source body, said source body having a plurality of layers of respectively different conductance forming with each other a junction parallel to the source side facing the substrate, the source layer at said side having the same type of conductance as said substrate; heating the source body by means of said heater and simultaneously subjecting said source body on said side to a gaseous atmosphere chemically combinable with the source material to deposit semiconductor material by transport reaction via the evolving gaseous compound from the source body onto the substrate, until at least two layers of respectively different conductance are transferred from the source body to the substrate.

12. The method of producing semiconductor members according to claim 11, wherein the heater is a body of graphite having its top coated with semiconductor material.

13. The method of producing semiconductor members according to claim 1, which comprises performing the transfer reaction within a processing vessel and simultaneously supplying the vessel with a gaseous mixture of halogen-hydrogen compound and carrier gas.

14. The method of producing semiconductor members according to claim 1, which comprises performing the transfer reaction within a processing vessel, simultaneously supplying the vessel with a gaseous mixture of a semiconductor-halogen compound and carrier gas, thermally dissociating the latter compound in the vessel and precipitating the resulting semiconductor material on the substrate side facing away from the source body.

15. The method of producing semiconductor members according to claim 14, wherein said latter semiconductor material is the same as the semiconductor material of the source body.

16. The method of producing semiconductor members according to claim 14, wherein said latter semiconductor material is different from the semiconductor material of the source body.

17. The method of producing semiconductor members according to claim 1, which comprises performing the transfer reaction within a processing vessel simultaneously supplying the vessel with a gaseous mixture of a semiconductor-halogen compound and carrier gas, thermally dissociating the latter compound in the vessel and precipitating upon the substrate side facing away from the source body a semiconductor layer having a different conductance from that of said substrate side.

18. The method of producing monocrystalline semiconductor members with layers of respectively different conductance, which comprises placing into a processing vessel a substrate of monocrystalline semiconductor material in face-to-face relation to a source body of semiconductor material, said source body having at least two layers of respectively different conductance forming with each other a junction parallel to the source side facing the substrate, the source layer at said side having the same type of conductance as said substrate; filling the vessel with a gaseous mixture of carrier gas and halogen compound of the source material, sealing the vessel, and heating the source body to deposit semiconductor material by transport reaction via the evolving gaseous compound from the source body onto the substrate, until at least two layers of respectively different conductance are transferred from the source body to the substrate.

19. The method of producing monocrystalline semiconductor members with layers of respectively different conductance, which comprises placing into a processing vessel a substrate of monocrystalline semiconductor material in face-to-face relation to a source body of semconductor material, said source body having at least two layers of respectively different conductance forming with each other a junction parallel to the source side facing the substrate, the source layer at said side having the same type of conductance as said substrate; covering the substrate with a cover plate of inert material on the side facing away from the source body, supplying the vessel with a gaseous mixture of carrier gas and halogen compound of the source material, and heating the source body to deposit semiconductor material by transport reaction via the evolving gaseous compound from the source body onto the substrate, until at least two layers of respectively different conductance are transferred from the source body to the substrate.

20. The method of producing semiconductor members according to claim 19, wherein the cover plate is formed of material selected from the group consisting of quartz, corundum and silicon carbide.

References Cited

UNITED STATES PATENTS

| | | | |
|---|---|---|---|
| 3,142,596 | 7/1964 | Theurer | 148—175 |
| 3,291,657 | 12/1966 | Sirth | 148—175 |

DAVID L. RECK, *Primary Examiner.*

N. F. MARKVA, *Assistant Examiner.*